US008987050B1

(12) United States Patent
Hiner et al.

(10) Patent No.: US 8,987,050 B1
(45) Date of Patent: Mar. 24, 2015

(54) METHOD AND SYSTEM FOR BACKSIDE DIELECTRIC PATTERNING FOR WAFER WARPAGE AND STRESS CONTROL

(71) Applicants: David Jon Hiner, Chandler, AZ (US); Ronald Patrick Huemoeller, Gilbert, AZ (US); Michael G. Kelly, Queen Creek, AZ (US)

(72) Inventors: David Jon Hiner, Chandler, AZ (US); Ronald Patrick Huemoeller, Gilbert, AZ (US); Michael G. Kelly, Queen Creek, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/690,817

(22) Filed: Nov. 30, 2012

(51) Int. Cl.
*H01L 21/44* (2006.01)
*H01L 21/48* (2006.01)
*H01L 21/50* (2006.01)
*H01L 21/312* (2006.01)
*H01L 21/31* (2006.01)
*H01L 21/768* (2006.01)
*H01L 23/48* (2006.01)

(52) U.S. Cl.
CPC .............. *H01L 21/312* (2013.01); *H01L 21/31* (2013.01); *H01L 21/768* (2013.01); *H01L 23/48* (2013.01)

USPC .................... 438/106; 438/667; 257/E21.499

(58) Field of Classification Search
USPC ................. 438/106, 612, 618, 666, 667, 692; 257/E21.499
See application file for complete search history.

(56) References Cited

U.S. PATENT DOCUMENTS

| 2010/0102435 A1* | 4/2010 | Ryan et al. .................... 257/692 |
| 2012/0302046 A1* | 11/2012 | Daniel et al. .................. 438/479 |
| 2013/0062736 A1* | 3/2013 | Brighton et al. .............. 257/621 |

* cited by examiner

*Primary Examiner* — Hoai V Pham
(74) *Attorney, Agent, or Firm* — McAndrews, Held & Malloy

(57) ABSTRACT

Methods and systems for backside dielectric patterning for wafer warpage and stress control are disclosed and may include thinning a semiconductor wafer comprising one or more through silicon vias (TSVs) and one or more die to expose the TSVs on a first surface of the wafer. The wafer may be passivated by depositing dielectric layers. The passivated wafer may be planarized and portions dielectric layers may be selectively removed to reduce a strain on the wafer. Metal contacts may be placed on the exposed TSVs prior to or after the selectively removal. The die may comprise functional electronic die or interposer die. Portions of the dielectric layers may be selectively removed in a radial pattern and may comprise a nitride and/or silicon dioxide layer. The wafer may be thinned to below a top surface of the TSVs. The dielectric layers may be selectively removed utilizing a dry etch process.

26 Claims, 9 Drawing Sheets

METHOD AND SYSTEM FOR BACKSIDE DIELECTRIC PATTERNING FOR WAFER WARPAGE AND STRESS CONTROL

CROSS-REFERENCE TO RELATED APPLICATIONS/INCORPORATION BY REFERENCE

This application makes reference to U.S. application Ser. No. 13/434,217, filed on Mar. 29, 2012. The above cited application is incorporated herein by reference in its entirety.

FIELD OF THE INVENTION

Certain embodiments of the invention relate to semiconductor chip packaging. More specifically, certain embodiments of the invention relate to a method and system for backside dielectric patterning for wafer warpage and stress control.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in a method and system for backside dielectric patterning for wafer warpage and stress control. Example aspects of the invention may comprise thinning a semiconductor wafer comprising one or more through silicon vias (TSVs) and one or more die, to expose the TSVs on a first surface of the semiconductor wafer. The first surface of the semiconductor wafer may be passivated by depositing one or more dielectric layers on the first surface. The passivated first surface may be planarized and portions of the one more dielectric layers may be selectively removed to reduce a strain on the semiconductor wafer. Metal contacts may be placed on the exposed TSVs prior to the selectively removing portions of the one or more dielectric layers. Metal contacts may be placed on the exposed TSVs after the selectively removing portions of the one or more dielectric layers. The one or more die may comprise functional electronic die or interposer die. Portions of the one more dielectric layers may be selectively removed in a radial pattern. The one or more dielectric layers may comprise a nitride layer and/or a silicon dioxide layer or organic dielectric layers. The wafer may be thinned to below a top surface of the TSVs. The one or more dielectric layers may be selectively removed utilizing a dry etch process, wet chemical etching, and/or laser ablation.

Figure 1A:
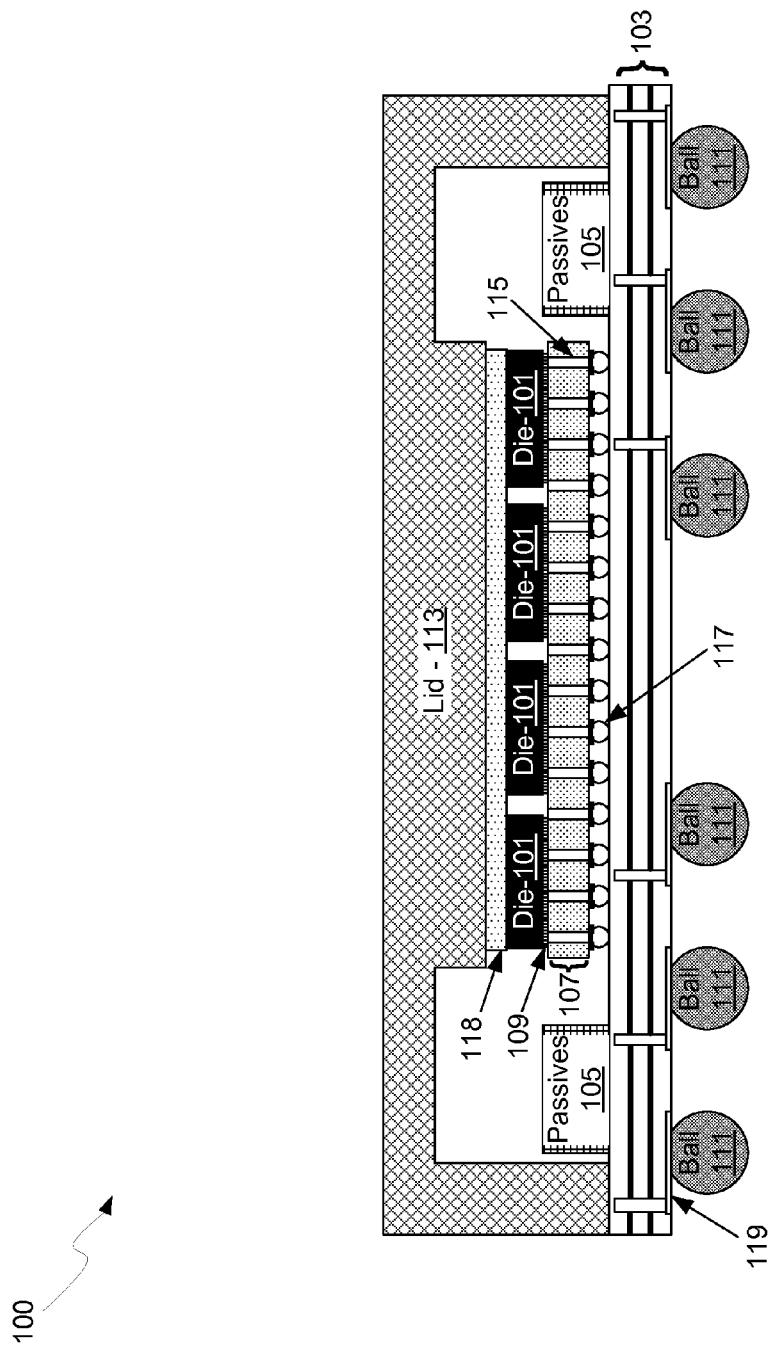
FIG. 1A is a drawing illustrating an integrated circuit package with a through-silicon-via interposer, in accordance with an example embodiment of the invention.

FIG. 1A is a drawing illustrating an integrated circuit package with a through-silicon-via interposer, in accordance with an example embodiment of the invention. Referring to FIG. 1A, there is shown a package 100 comprising die 101, a packaging substrate 103, passive devices 105, an interposer 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 101 may comprise micro-bumps 109 for providing electrical contact between the circuitry in the die 101 and contact pads on the surface of the interposer 107.

The interposer 107 may comprise an interposer die separated from a semiconductor wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 113 and the packaging substrate 103. A thermal interface may be created for heat transfer out of the die 101 to the lid 113 via the thermal interface material 118, which may also act as an adhesive.

In an example scenario, the package 100 may be fabricated utilizing the interposer 107 comprising TSVs 115. A wafer of interposers, also referred to herein as an interposer wafer, may be thinned and/or etched to expose the TSVs 115. Dielectric layers may be deposited on the back surface of the interposer 107 when in die or wafer form for passivation purposes. The deposited dielectric layers may impose strain on the die or wafer, which may cause bowing of the die and/or wafer. This strain may be mitigated by selectively removing the dielectric layers on the back surface in areas where it is not needed for passivation purposes. The dielectric layers may be removed in patterns selected to remove strain that may vary across the die and/or wafer.

Figure 1B:
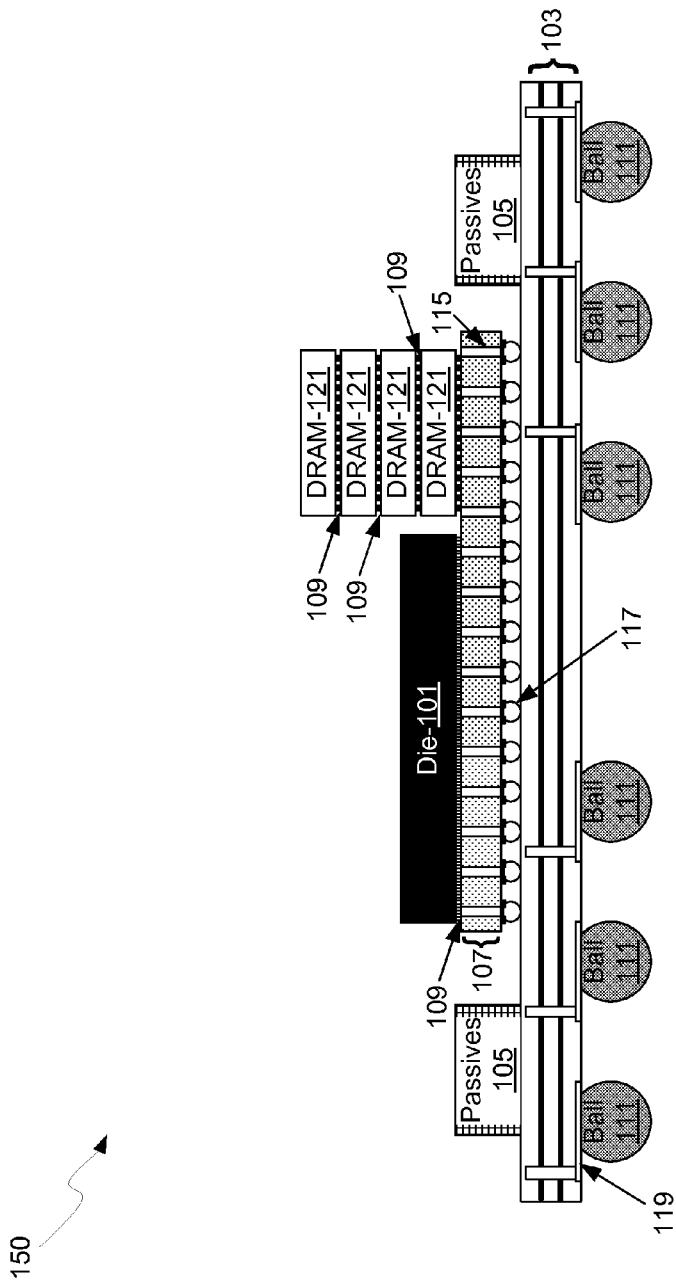
FIG. 1B is a drawing illustrating an integrated circuit package with through-silicon-via die and interposer, in accordance with an example embodiment of the invention.

FIG. 1B is a drawing illustrating an integrated circuit package with through-silicon-via die and interposer, in accordance with an example embodiment of the invention. Referring to FIG. 1B, there is shown a package 150 comprising the die 101, the packaging substrate 103, the passive devices 105, the interposer 107, and a stack of dynamic random access memory (DRAM) 121. The die 101, the packaging substrate 103, the passive devices 105, and the interposer 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The DRAM 121 may be stacked front-to-back and therefore comprise TSV's for providing electrical connectivity between the individual die.

In an example scenario, the package 150 may be fabricated utilizing the interposer 107 and the DRAM 121 comprising TSVs. An interposer wafer may be thinned and/or etched to expose the TSVs 115. Dielectric layers may be deposited on the back surface of the interposer 107 and/or the DRAM 121 when in die or wafer form for passivation purposes. The deposited dielectric layers may impose strain on the die or wafer, which may cause bowing of the die and/or wafer. This strain may be mitigated by selectively removing the dielectric layers on the back surface in areas where it is not needed for passivation purposes. The dielectric layers may be removed in patterns selected to remove strain that may vary across the die and/or wafer.

It should be noted that the packaging embodiments shown in FIGS. 1A and 1B are merely examples. Accordingly, any packaging technology may be utilized with the backside dielectric patterning described herein.

Figure 2:
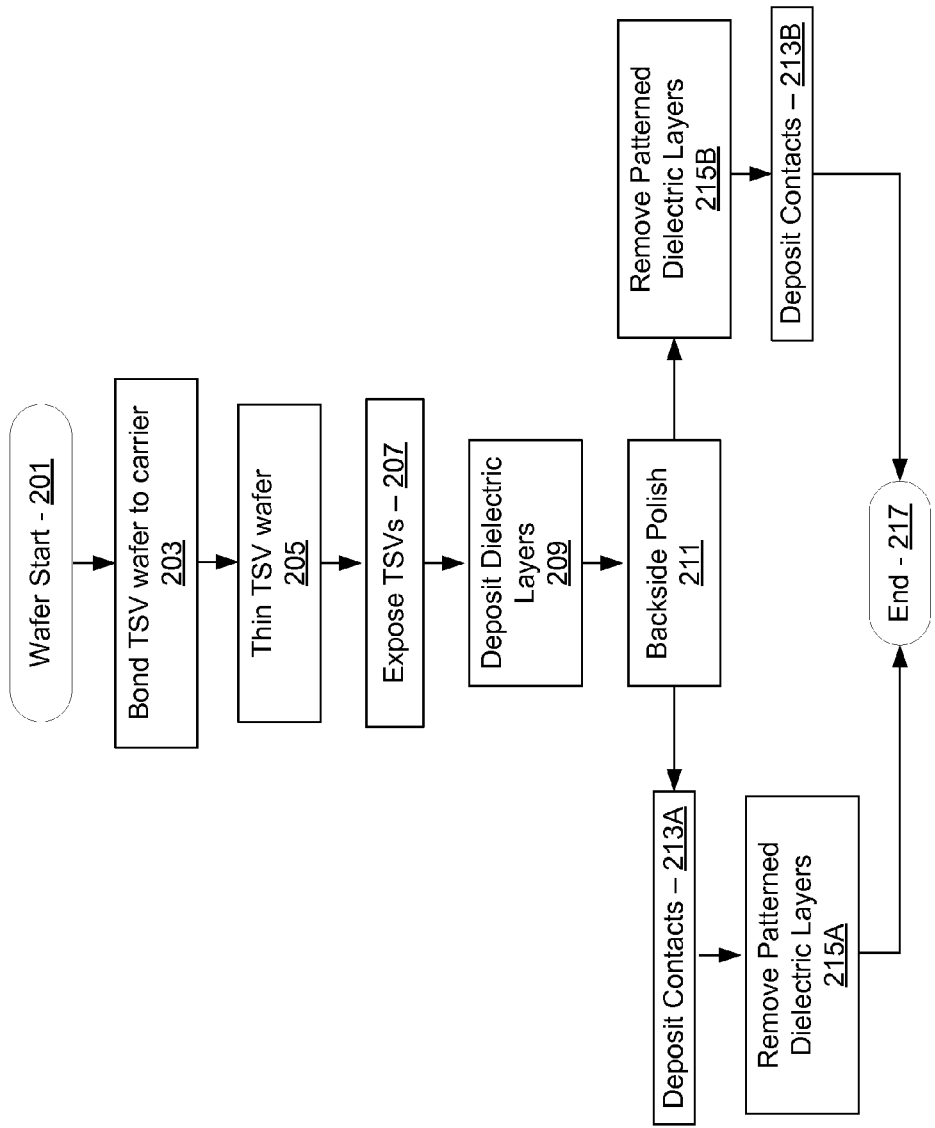
FIG. 2 is a flow diagram illustrating example steps in a through-silicon-via backside dielectric patterning process, in accordance with an example embodiment of the invention.
Figures 3A, 3B:
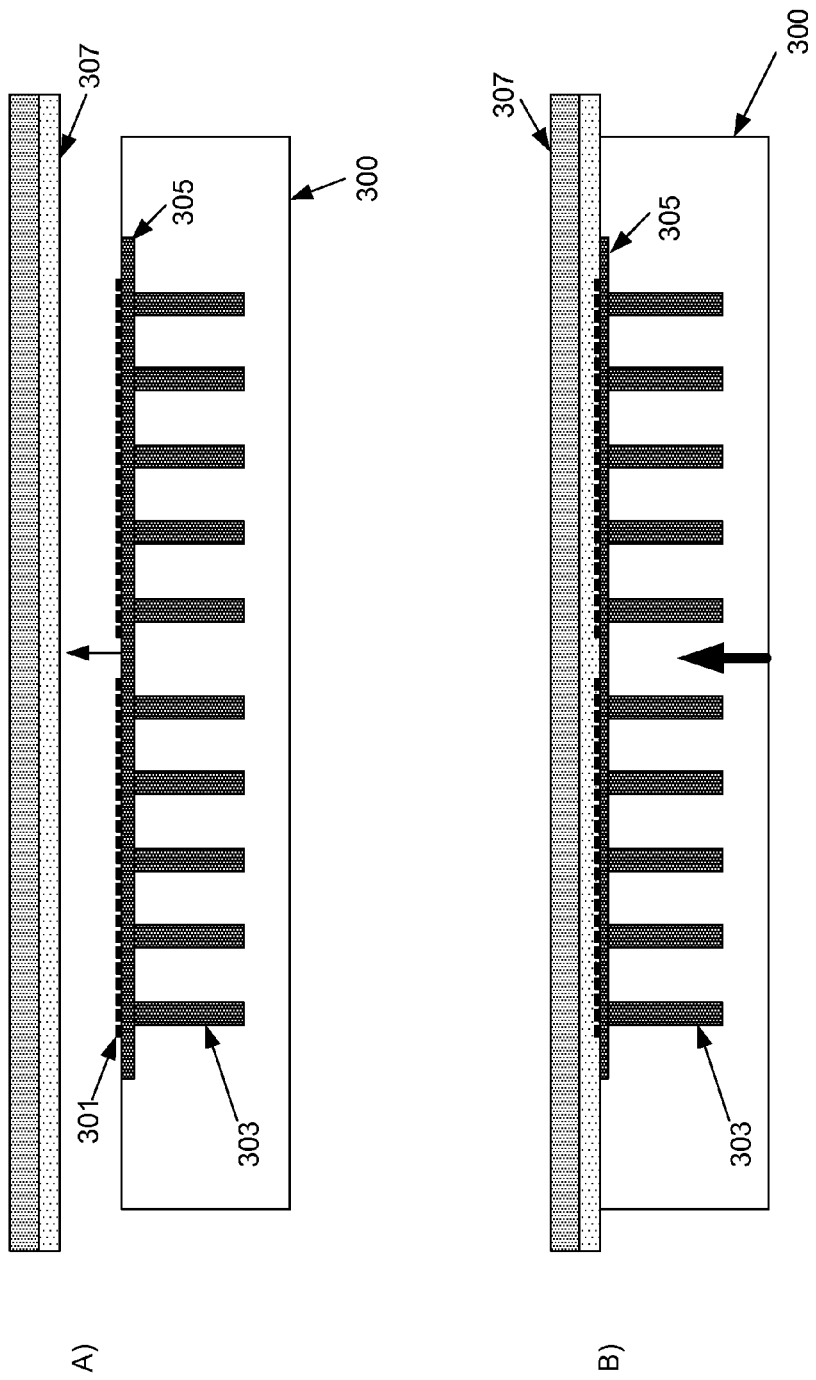
FIGS. 3A-3E are drawings illustrating example steps in a through-silicon-via wafer thinning and passivating process, in accordance with an example embodiment of the invention.

FIG. 2 is a flow diagram illustrating example steps in a through-silicon-via backside dielectric patterning process, in accordance with an example embodiment of the invention. Referring to FIG. 2, the example steps begin with wafer start step 201 and bond TSV wafer to carrier step 203 where a wafer comprising TSVs may be bonded to a carrier in step 203 for subsequent processing, as is illustrated in FIG. 3A.

The TSV wafer may then be thinned in the thin TSV wafer step 205. The wafer may be thinned to expose the tops of the TSVs in the wafer. The TSVs may be further exposed in an etch process, for example, in expose TSVs step 207, with the wafer thinning steps illustrated in FIGS. 3B-3C.

Figures 3C, 3D:
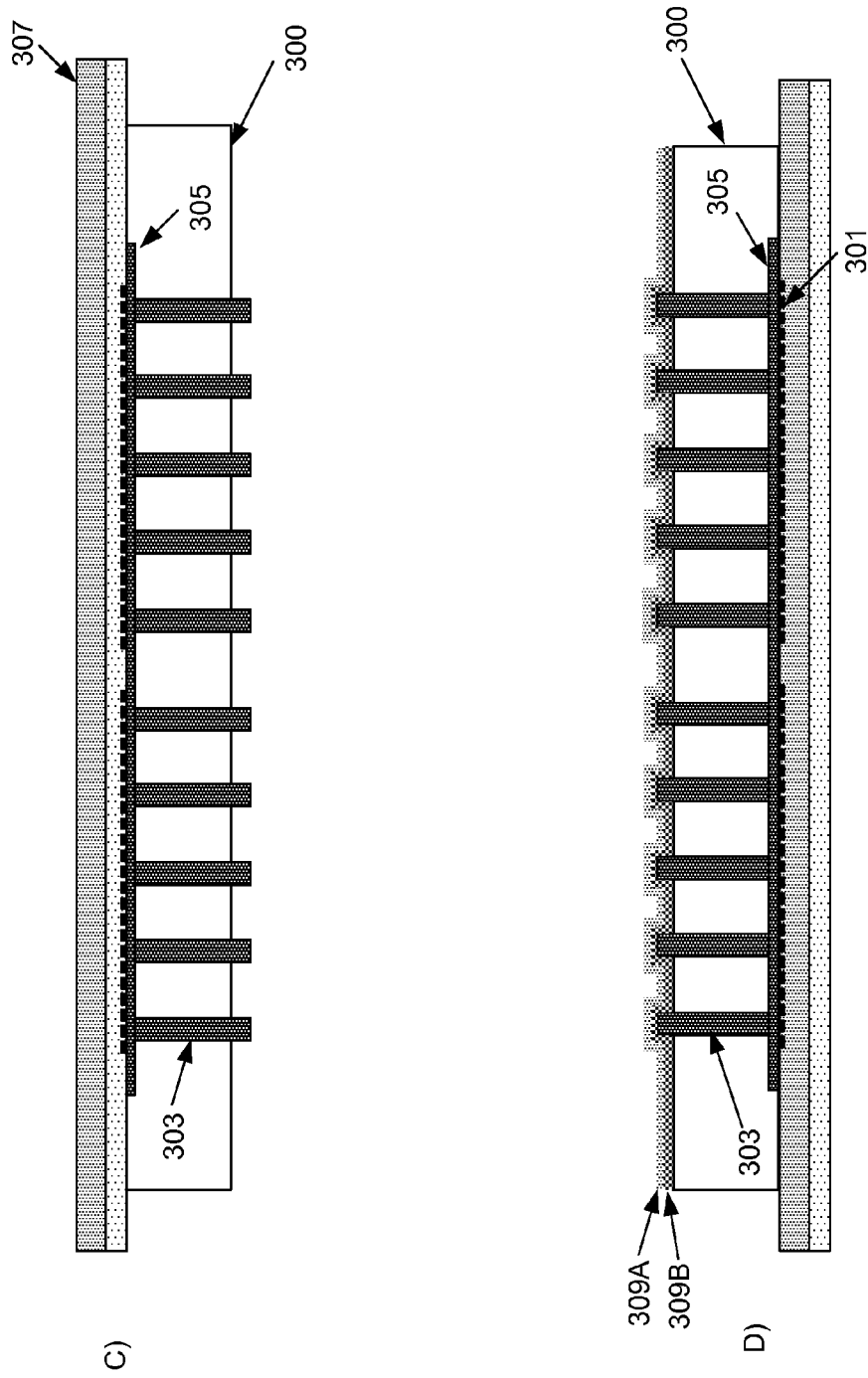

The thinned wafer with exposed TSVs may then be passivated with insulating layers in the deposit dielectric layers step 209. In an example scenario, a nitride layer and an oxide layer may be deposited on the thinned wafer in a conformal manner over the exposed TSVs, as is illustrated in FIG. 3D. However, any insulating materials may be used as passivating layers for the thinned TSV wafer for desired insulating properties and mechanical characteristics, for example.

In instances where the TSV wafer was thinned to below the top surface of the exposed TSVs, as shown in FIG. 3C, which were then covered in a conformal layer, as shown in FIG. 3D, the backside may be polished to remove the passivating layers on the top of the TSVs in the backside polish step 211, resulting in the structure shown in FIG. 3E.

Processing of the thinned and passivated TSV wafer may then proceed through one of two paths, either through steps 213A and 215A or through steps 215B and 213B, as shown by the two paths in FIG. 2. For example, in the first path, the contacts may be deposited on the exposed TSVs in deposit contacts step 213A, followed by remove patterned dielectric layers step 215A. In this latter step, the dielectric layers may be patterned and selectively removed to reduce the strain imposed on the substrate by the dielectric layers. Such processing is further illustrated in FIGS. 4A-4B.

In the alternative path, the dielectric layers may be selectively removed in the remove patterned dielectric layers step 215B, followed by the deposit contacts step 213B. Such processing is further illustrated in FIGS. 5A-5B. Accordingly, the deposit contacts steps 213A and 213B may be substantially similar, and the remove patterned dielectric layers steps 215A and 215B may be substantially similar, but performed in different order in the two alternative paths shown in FIG. 2. The example flow then ends at step 217.

FIGS. 3A-3E are drawings illustrating example steps in a through-silicon-via wafer thinning and passivating process, in accordance with an example embodiment of the invention. Referring to FIG. 3A, there is shown a semiconductor wafer 300 comprising front side pads 301, TSVs 303, and redistribution layers 305. There is also shown a support structure 307.

The semiconductor wafer 300 may comprise one or more active electronics die and/or an interposer wafer, for example. Electronics die may comprise electrical circuitry such as digital signal processors (DSPs), network processors, power management units, audio processors, RF circuitry, wireless baseband system-on-chip (SoC) processors, sensors, and application specific integrated circuits, for example. In instances where the semiconductor wafer 300 comprises an interposer wafer, the front side pads 301 may be operable to couple one or more active die to the semiconductor wafer 300 (e.g., before and/or after separating such an interposer wafer into individual interposer die).

In instances where the semiconductor wafer 300 comprises active die, the front side pads 301 may be operable to couple other die to the die in the semiconductor wafer 300 (e.g., before and/or after separating such an active die wafer into individual active die). An example of such an arrangement is shown by the stack of DRAM 121 shown in FIG. 1B, where each of the DRAM 121 is coupled to one or more other die and/or an interposer die.

The redistribution layers 305 may comprise conductive traces in or on the front surface of the semiconductor wafer 300 for coupling the front side pads 301 to other pads and to the TSVs 303. In instances where the semiconductor wafer 300 comprises active electronics die, the redistribution layers 305 may couple the front side pads 301 to circuitry in the die.

The support structure 307 may comprise a planar rigid structure for supporting the semiconductor wafer 300 during thinning and other processing steps. While FIGS. 3A-5B show the support structure 307 being utilized throughout, it may be removed at any time during the process, for example if steps are to be performed on the front side of the TSV 300 or if the semiconductor wafer 300 is able to withstand processing steps without extra support.

In an example scenario, the support structure may comprise a rigid support layer, such as a metal plate, for example, and an adhesive layer for attaching the semiconductor wafer 300, as illustrated by the two-layer structure shown for the support structure 307 in FIGS. 3A-5B.

Once the support structure 307 is attached to the semiconductor wafer 300, as shown in FIG. 3B, the TSV wafer may be thinned, in the direction illustrated by the thick arrow in FIG. 3B. This thinning may be performed utilizing a chemical mechanical polish (CMP), for example, and/or a chemical etch process. In an example scenario, a CMP process may thin the TSV wafer to just expose the TSVs 303 and a chemical etch process may further thin the wafer further to result in the TSVs extending beyond the etched surface, as illustrated in FIG. 3C.

As shown in FIG. 3D, the surface of the semiconductor wafer 300 with the exposed TSVs may then be passivated with the dielectric layers 309A and 309B. In an example scenario, one layer may comprise a nitride, such as silicon nitride, for example, while the other layer may comprise a silicon dioxide layer. Furthermore, the invention is not limited to two dielectric layers. Accordingly, a single dielectric layer may be deposited, or a stack of 2, 3, 4, or more dielectric layers may be utilized.

The dielectric layers 309A and 309B may be deposited using PECVD or electron-beam deposition techniques, for example. However, the invention is not so limited, as any insulating material or deposition technique used for passivation purposes may be utilized. For example, an organic passivation may be spun on, which may allow photolithography and etching of the dielectric as opposed to PECVD deposition and dry etching techniques that may be utilized for inorganic passivation layers.

The dielectric layers 309A and 309B may cover the exposed TSVs in a conformal fashion, i.e., covering the sides of the TSVs 303 as well as the top. The structural properties of the dielectric layers 309A and 309B, in comparison to the structural properties of semiconductor wafer 300, may cause strain on the wafer 300, possibly resulting in bowing of the wafer 300. This strain may be reduced by selectively removing portions of the dielectric layers 309A and 309B where passivation is not needed and/or where less passivation is needed. For example, in a DRAM die, such as the DRAM 121 illustrated in FIG. 1B, the metal interconnects for coupling the die to another die may be centered in a small region of the die. Accordingly, the dielectric layers outside of the interconnect region on the die may be removed, either wholly or in patterns, to reduce the strain on the wafer.

The passivated semiconductor wafer 300 may then be backside polished, via a CMP process, for example, to planarize the surface by removing the dielectric material on the top surface of the TSVs 303. The resulting structure is shown in FIG. 3E, showing the TSVs again exposed for subsequent contact. The backside polished TSV wafer may then be processed via one of two parallel process paths, as illustrated by the two paths in FIG. 2.

Figures 4A, 4B:
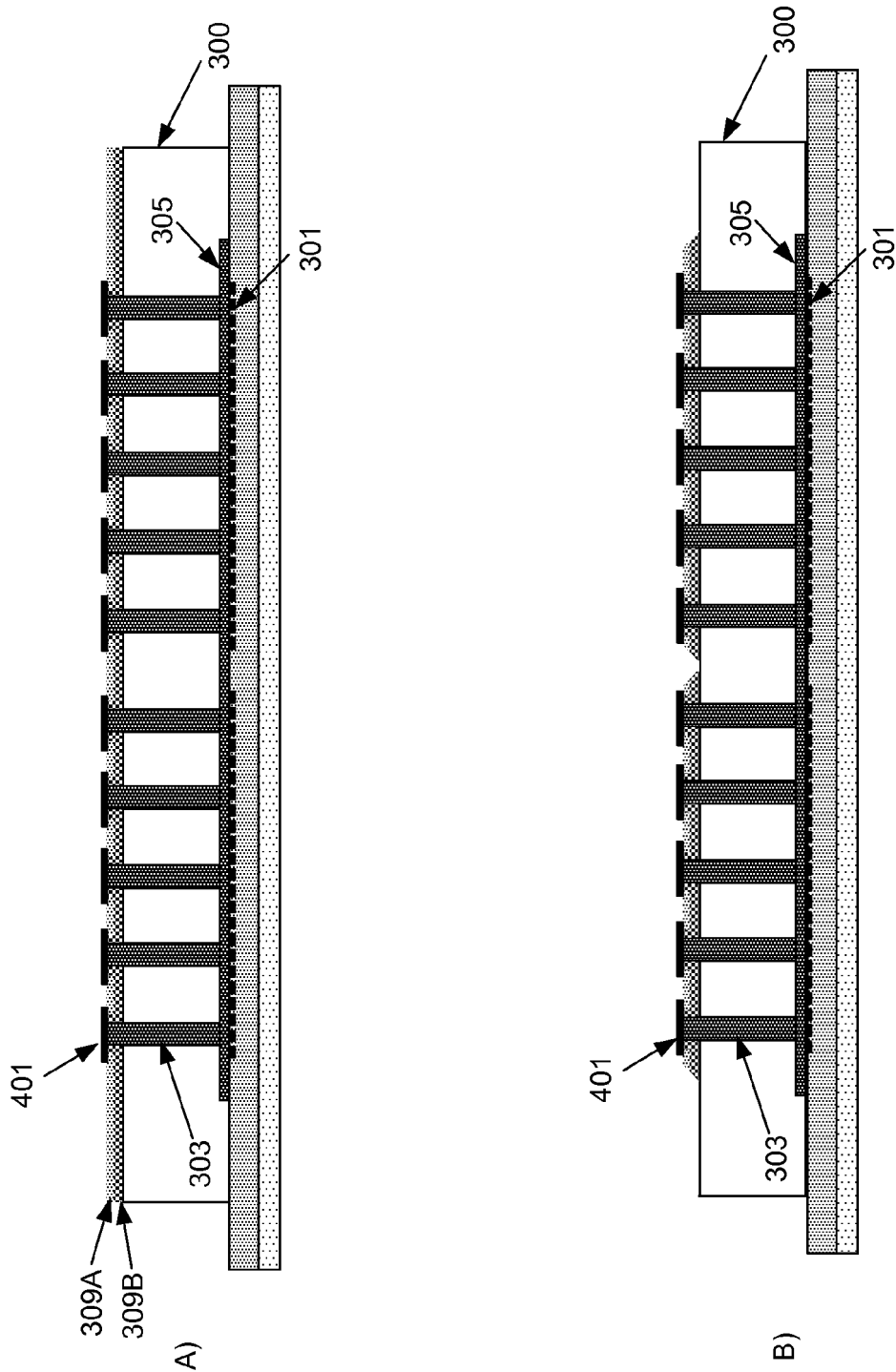
FIGS. 4A-4B are drawings illustrating a contact deposition and dielectric patterning process, in accordance with an example embodiment of the invention.

FIGS. 4A-4B are drawings illustrating a contact deposition and dielectric patterning process, in accordance with an example embodiment of the invention. Referring to FIG. 4A, there is shown the semiconductor wafer 300 comprising the front side pads 301, the TSVs 303, the redistribution layers 305, and the dielectric layers 309A and 309B. The process steps in FIGS. 4A and 4B correlate to the deposit contacts step 213A and remove patterned dielectric layers step 215A, respectively, shown in FIG. 2.

Figure 3E:
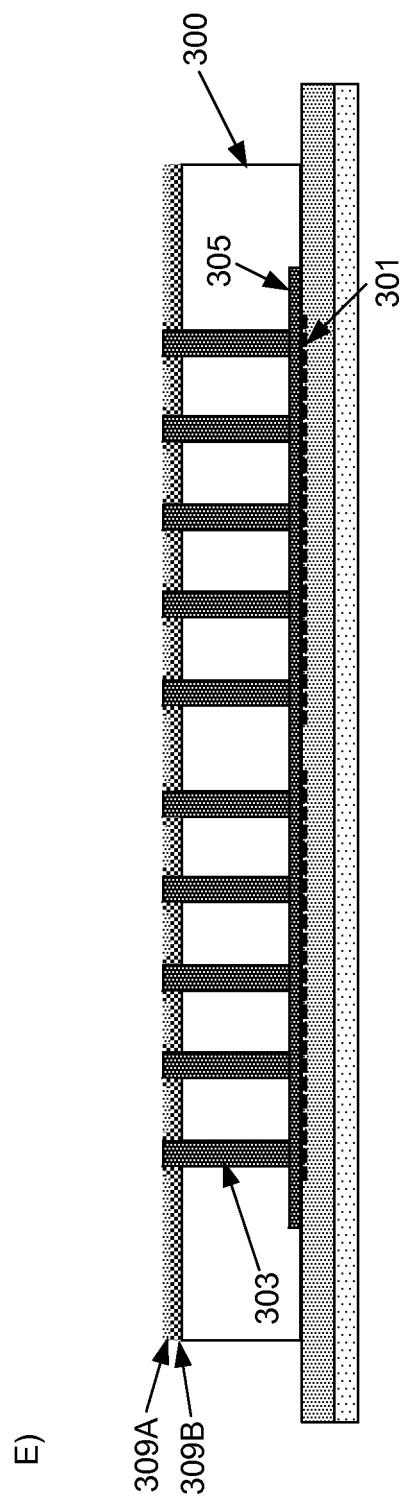

Metal contacts may be deposited on the structure shown in FIG. 3E, resulting in the metal contacts 401, or back side pads, shown in FIG. 4A. A photolithography process may be utilized to place the metal contacts 401 on the exposed TSVs. Accordingly, a photoresist layer may be spun on the planarized structure of FIG. 3E, with a mask used to expose the photoresist after curing. In another example embodiment, other masking materials may be utilized, such as inorganic materials, if desired, but this may result in further processing requirements. The exposed photoresist may be removed upon development, assuming a positive photoresist process, resulting in a totally covered surface other than over the TSVs 303 and other places on the semiconductor wafer 300 where a metal interconnect is desired.

A metal deposition process may then be utilized to deposit metal contacts on the exposed TSVs 303, resulting in the structure shown in FIG. 4A. Following metal deposition, the metal contact mask layer may be removed and a second mask layer, such as a photoresist layer, may be applied to define regions of the dielectric layers 309A and 309B. The photoresist layer may be patterned by exposing the layer with UV light through a mask pattern.

Once the mask layer has been patterned, the exposed regions of the dielectric layers 309A and 309B may be removed in an etching process. The etch technique utilized is based on the type of dielectric layer utilized. For example, a wet chemical etch may be used for silicon dioxide while a dry etch, such as a plasma etch, for example, may be used for a nitride layer. Additionally, a combination of wet and dry etching techniques may be utilized, depending on the materials used for the dielectric layers. Additionally, a laser ablation process may be utilized to remove the dielectric layers 309A and 309B. Following the etch of the dielectric layers 309A and 309B, the mask layer may be removed.

FIG. 4B illustrates the semiconductor wafer 300 after the dielectric layers 309A and 309B have been selectively removed. It should be noted that the profile of the etched dielectric layers shown in FIG. 4B is only an example, and may vary depending on the type of etch used and the materials used for the dielectric layers. Accordingly, the remaining dielectric layers may have vertical, sloped, or curved sidewalls.

Furthermore, the area of the dielectric layers removed, as shown in FIG. 4B, is merely an example. More or less of the dielectric layers may be removed, depending on the area of the semiconductor wafer 300 needing passivation and the amount of acceptable strain, for example.

In example scenarios in which multiple dielectric layers are formed on the wafer, different respective amounts of dielectric material may be removed from different respective layers. For example, in various example scenarios, a significant amount of dielectric material may be removed from a first layer, while an insignificant amount (or none) of dielectric material may be removed from a second layer. In various other example scenarios, a generally consistent amount of dielectric material may be removed from each of a plurality of layers.

Figures 5A, 5B:
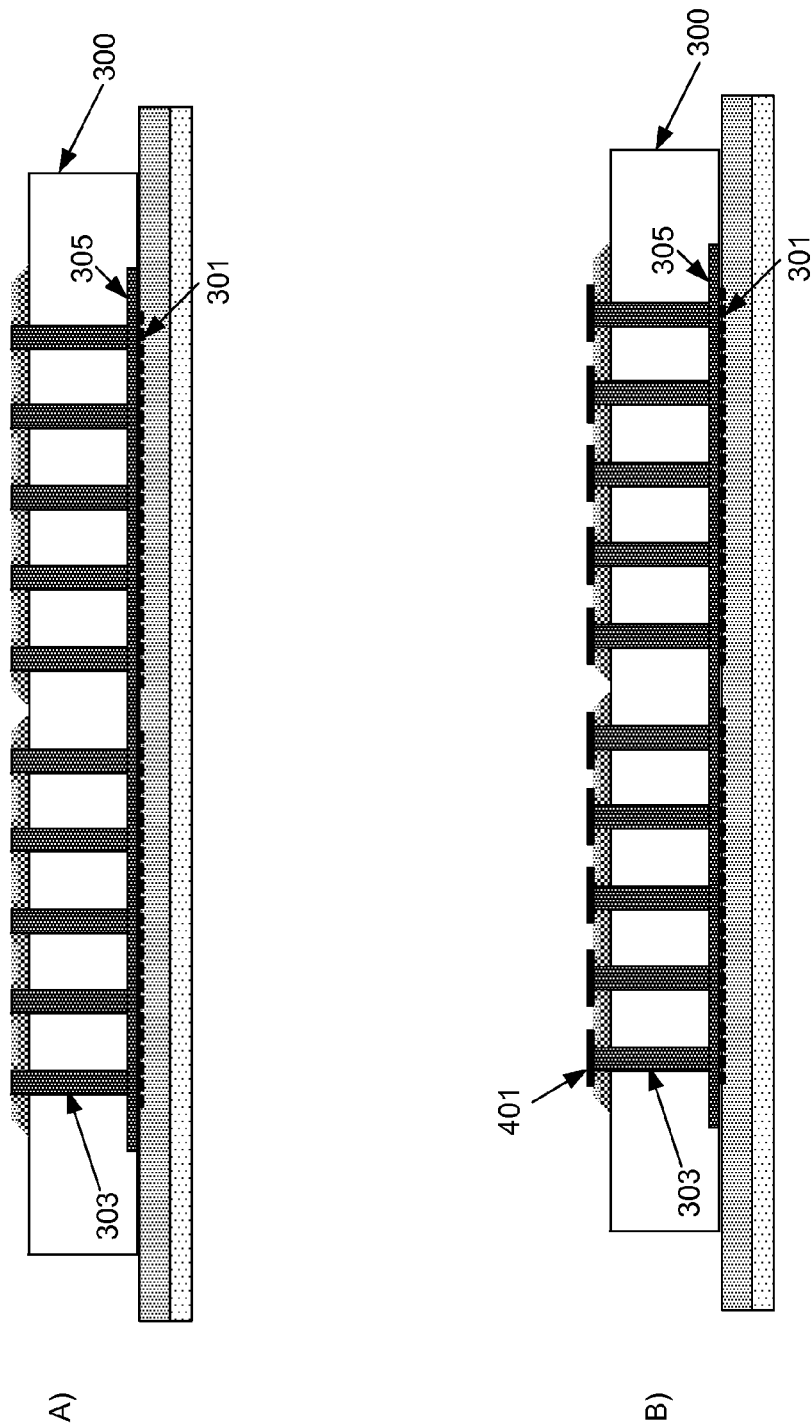
FIGS. 5A-5B are drawings illustrating a dielectric patterning and contact deposition process, in accordance with an example embodiment of the invention.

FIGS. 5A-5B are drawings illustrating a dielectric patterning and contact deposition process, in accordance with an example embodiment of the invention. Referring to FIG. 5A, there is shown the semiconductor wafer 300 comprising the front side pads 301, the TSVs 303, the redistribution layers 305, and the dielectric layers 309A and 309B. The process steps in FIGS. 5A and 5B correlate to the remove patterned dielectric layers step 215B and deposit contacts step 213B, respectively shown in FIG. 2.

In this process, the dielectric layers 309A and 309B may be selectively removed prior to placing metal contacts on the exposed TSVs 303. Accordingly, a photoresist layer may be applied to the structure illustrated in FIG. 3E. The photoresist layer may be exposed to UV light through a mask pattern that protects the areas where dielectric layers should remain, assuming a positive photoresist, and the exposed regions removed in a subsequent development step.

The exposed regions of the dielectric layers 309A and 309B may then be removed utilizing a dry or wet etch, or a combination of wet and dry etch, followed by a mask removal process, resulting in the structure illustrated in FIG. 5A.

A second mask layer may be deposited on the semiconductor wafer 300 with etched dielectric layers 309A and 309B to delineate areas for the subsequent deposition of metal contacts, such as over the exposed TSVs 303 and any other areas where metal contacts are desired on the TSV wafer 303. The mask layer may be patterned utilizing a UV exposure through a mask pattern, with the exposed mask layer regions being removed in a subsequent development process, again assuming a positive photoresist process. However, this, and any of the previously discussed photoresist processes, may utilize negative photoresist to result in different sidewall profiles, for example.

Once cured, the patterned mask layer may enable the deposition of metal contacts over the exposed regions of the semiconductor wafer 300, such as over the exposed TSVs 303. Metal may be deposited utilizing a thermal, electron beam, or ion beam deposition process, for example. Once the metal contacts 401 are deposited, the mask layer may be removed, resulting in the structure shown in FIG. 5B.

Figure 6:
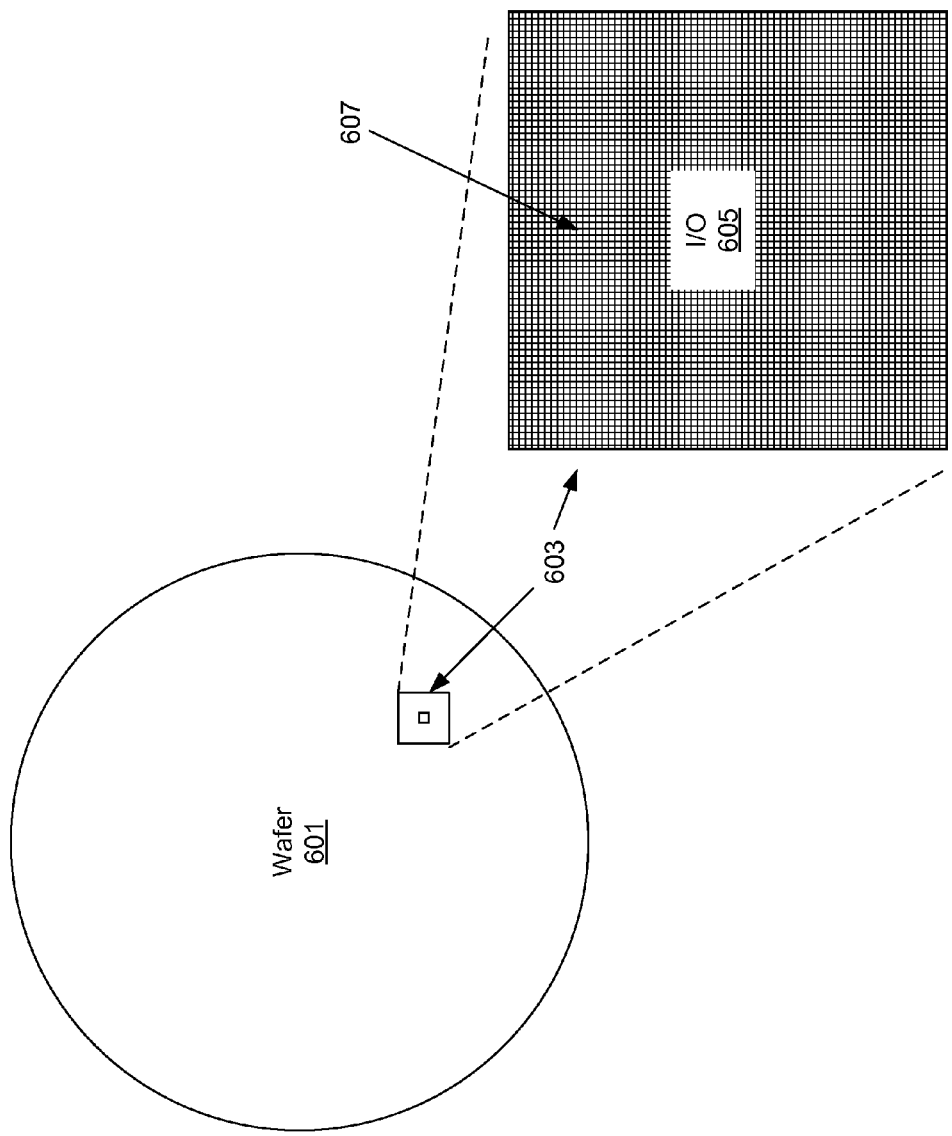
FIG. 6 is a drawing illustrating a wafer with patterned dielectric layers, in accordance with an example embodiment of the invention.

FIG. 6 is a drawing illustrating a wafer with patterned dielectric layers, in accordance with an example embodiment of the invention. Referring to FIG. 6, there is shown a semiconductor wafer 601 comprising a plurality of die, such as the die 603. The die 603 may comprise an input/output (I/O) region 605 and patterned dielectric layers 607.

In an example scenario, the semiconductor wafer 601 may comprise a plurality of die 603 comprising functional electronic die, such as processor or memory die, for example. The I/O region 605 may comprise a region of the die 603 where metal interconnects for coupling to other die/and or substrates are located. In an example scenario, the I/O region 605 may comprise a plurality of front side pads for coupling to other die. Accordingly, the I/O region 605 may comprise passivation layers, while the passivation layers over the remaining area of the die 603 may be selectively removed.

The inset in the lower right corner of FIG. 6 shows a magnified view of the die 603, where the patterned dielectric layers 607 exhibit a checkerboard pattern in an example embodiment. It should be noted that the checkerboard pattern is merely an example, and any pattern may be utilized depending on the amount of strain to be relieved. The region surround the die 603 may be left intact, i.e. without any patterning, as well as in the I/O region 605. In another example embodiment, the dielectric layers may be selectively removed in grooves circumferentially around the semiconductor 601.

Furthermore, the dielectric patterning may vary across the wafer 601, such that die near to the outer edge of the semiconductor wafer 601 have a different dielectric pattern compared to die near the center of the wafer 601, i.e., a radial pattern. This may be suitable in instances where strain is non-uniform across the wafer 601. Thus, the dielectric patterning may comprise a radial pattern, may vary linearly across the wafer or die, or may vary in any other pattern that corresponds to a strain field in the semiconductor wafer 601.

The I/O region 605 may comprise a region of input and output interconnects where the dielectric layers may remain intact, i.e., without any patterning. In this example embodiment, most of the dielectric layers across the die 603 have been patterned and only a small region near the center is not patterned. Therefore, strain from the dielectric layers may be considerably decreased.

In an embodiment of the invention, a method and system are disclosed for thinning a semiconductor wafer 300, 601 comprising one or more through silicon vias (TSVs) 303 and one or more die 603 to expose the TSVs 303 on a first surface of the semiconductor wafer 300, 601. The first surface of the semiconductor wafer 300, 601 may be passivated by depositing one or more dielectric layers 309A, 309B on the first surface.

The passivated first surface may be planarized and portions of the one or more dielectric layers 309A, 309B may be selectively removed to reduce a strain on the semiconductor wafer 300, 601. Metal contacts 401 may be placed on the exposed TSVs 303 prior to the selectively removing portions of the one or more dielectric layers 309A, 309B. Metal contacts 401 may be placed on the exposed TSVs 303 after the selectively removing portions of the one or more dielectric layers 309A, 309B.

The one or more die 603 may comprise functional electronic die, such as die 121 or DRAM 121, or interposer die, such as the interposer 107. Portions of the one or more dielectric layers 309A, 309B may be selectively removed in a radial pattern. The one or more dielectric layers 309A, 309B may comprise a nitride layer and/or a silicon dioxide layer, or one or more organic dielectric layers. The semiconductor wafer 300, 601 may be thinned to below a top surface of the TSVs 303. The one or more dielectric layers 309A, 309B may be selectively removed utilizing a dry etch process, wet chemical etching, or laser ablation.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor processing, the method comprising:
   in a semiconductor wafer comprising one or more through silicon vias (TSVs) and one or more die:
      thinning said wafer to expose said TSVs on a first surface of said semiconductor wafer;
      passivating said first surface of said semiconductor wafer by depositing one or more dielectric layers on said first surface;
      planarizing the passivated first surface; and selectively removing portions of said one more dielectric layers to reduce a strain on said semiconductor wafer.

2. The method according to claim 1, comprising placing metal contacts on said exposed TSVs prior to said selectively removing portions of said one or more dielectric layers.

3. The method according to claim 1, comprising placing metal contacts on said exposed TSVs after said selectively removing portions of said one or more dielectric layers.

4. The method according to claim 1, comprising selectively removing said portions of said one more dielectric layers in a radial pattern.

5. The method according to claim 1, wherein said one or more dielectric layers comprise one or more plasma deposited films.

6. The method according to claim 5, wherein said one or more plasma deposited films comprise one or more of: a nitride layer and a silicon dioxide layer.

7. The method according to claim 1, wherein said one or more dielectric layers comprise one or more organic films.

8. The method according to claim 1, comprising thinning said semiconductor wafer to below a top surface of said TSVs.

9. The method according to claim 1, comprising selectively removing said one or more dielectric layers utilizing one or more of: a dry etch process, wet chemical etching, and laser ablation.

10. The method according to claim 1, comprising reducing warpage of said semiconductor wafer by said reducing of said strain.

11. The method according to claim 1, wherein the semiconductor die comprises an interposer die.

12. The method according to claim 1, wherein the selectively removing portions of said one more dielectric layers comprises forming grooves in the one or more dielectric layers.

13. The method according to claim 1, comprising selectively removing said portions of said one more dielectric layers in a checkerboard pattern.

14. A method for semiconductor processing, the method comprising:
    passivating a first surface of a semiconductor die by, at least in part, forming one or more dielectric layers over the first surface configured to support contacts for bonding the semiconductor die to a packaging substrate; and
    forming stress-relieving features in the one or more dielectric layers.

15. The method according to claim 14, wherein said passivating and said forming are performed when the die is in wafer form.

16. The method according to claim 14, wherein said forming stress-relieving features comprises forming grooves in the one or more dielectric layers.

17. The method according to claim 14, wherein said forming stress-relieving features comprises forming a checkerboard pattern in the one or more dielectric layers.

18. The method according to claim 14, wherein said forming stress-relieving features comprises removing a portion of the one or more dielectric layers over a non-electrically active region of the die while refraining from removing a portion of the one or more dielectric layers over an electrically active region of the die.

19. The method according to claim 14, wherein said forming stress-relieving features comprises forming a pattern in a portion of the one or more dielectric layers corresponding to a first region of the semiconductor die that is different from of an input/output region of said semiconductor die.

20. The method according to claim 14, wherein said forming stress-relieving features comprises selectively removing the one or more dielectric layers utilizing one or more of; a dry etch process, wet chemical etching, and laser ablation.

21. The method according to claim 14, wherein:
    the first surface comprises:
        contact zones configured for supporting the contacts; and
        contactless zones between the contact zones;
    the stress relieving features comprise:
        stress relieving zones over the first surface where material is removed from a first dielectric layer of the one or more dielectric layers;
    and
        forming the stress-relieving features comprises: locating the stress-relieving features over the first surface such that a thickness of the first dielectric layer is greater over a majority of the contactless zones than over the stress relieving zones.

22. The method according to claim 14, wherein the forming stress-relieving features in the one or more dielectric layers comprises removing a portion of the dielectric layers down to the first surface of the semiconductor die.

23. A method for semiconductor processing, the method comprising:
    passivating a first surface of a semiconductor die by, at least in part, forming one or more dielectric layers over the first surface; and
    forming stress-relieving features in the one or more dielectric layers wherein said forming stress-relieving features comprises forming a pattern in a portion of the one or more dielectric layers corresponding to a first region of the semiconductor die that is different from of an input/output region of said semiconductor die.

24. The method according to claim 23, wherein said forming stress-relieving features comprises forming grooves in the one or more dielectric layers.

25. The method according to claim 23, wherein said forming stress-relieving features comprises forming a checkerboard pattern in the one or more dielectric layers.

26. The method according to claim 23, wherein said forming stress-relieving features comprises selectively removing the one or more dielectric layers utilizing one or more of; a dry etch process, wet chemical etching, and laser ablation.

\* \* \* \* \*